US008823378B2

(12) United States Patent
Hardy et al.

(10) Patent No.: US 8,823,378 B2
(45) Date of Patent: Sep. 2, 2014

(54) SYSTEM AND METHOD FOR INDUCTIVELY COMMUNICATING DATA

(75) Inventors: Christopher Judson Hardy, Schenectady, NY (US); Thomas Kwok-Fah Foo, Clifton Park, NY (US); Robert Steven Stormont, Hartland, WI (US); Kenneth William Rohling, Porter Corners, NY (US); Selaka Bandara Bulumulla, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 414 days.

(21) Appl. No.: 12/977,534

(22) Filed: Dec. 23, 2010

(65) Prior Publication Data

US 2012/0161767 A1    Jun. 28, 2012

(51) Int. Cl.
    G01R 33/28      (2006.01)
    H04B 5/00       (2006.01)
    G01R 33/36      (2006.01)
    G01R 33/3415    (2006.01)

(52) U.S. Cl.
    CPC .......... H04B 5/0093 (2013.01); G01R 33/3415 (2013.01); G01R 33/3642 (2013.01)
    USPC ........................................ 324/318; 455/41.1

(58) Field of Classification Search
    CPC ........... G01R 33/3415; G01R 33/3642; H04B 5/0093
    USPC ........... 324/300–322; 600/421–422; 382/131; 455/41.1
    See application file for complete search history.

(56) References Cited

U.S. PATENT DOCUMENTS

| 5,243,289 | A  |   | 9/1993  | Blum et al. |
|-----------|----|---|---------|-------------|
| 5,585,721 | A  |   | 12/1996 | Datsikas |
| 6,049,206 | A  |   | 4/2000  | Sharp |
| 6,990,223 | B2 | * | 1/2006  | Ma et al. .................... 382/131 |
| 7,002,347 | B2 | * | 2/2006  | Feiweier et al. .............. 324/318 |
| 7,173,426 | B1 | * | 2/2007  | Bulumulla et al. ........... 324/318 |
| 7,259,562 | B2 |   | 8/2007  | Wang et al. |
| 7,345,485 | B2 |   | 3/2008  | Jevtic et al. |
| 7,432,713 | B2 |   | 10/2008 | Candidus et al. |
| 7,602,182 | B2 |   | 10/2009 | Heid et al. |
| 7,609,063 | B2 |   | 10/2009 | Xue et al. |
| 7,619,413 | B2 |   | 11/2009 | Wiggins et al. |
| 2009/0315556 | A1 | * | 12/2009 | Driemel et al. .............. 324/307 |

FOREIGN PATENT DOCUMENTS

| DE | 3500456 A1  | 7/1985 |
| DE | 3935082 C1  | 1/1991 |
| DE | 19751017 A1 | 5/1999 |
| DE | 10130615 A1 | 1/2003 |
| EP | 0437049 A2  | 7/1991 |

* cited by examiner

*Primary Examiner* — Melissa Koval
*Assistant Examiner* — Rishi Patel
(74) *Attorney, Agent, or Firm* — Seema S. Katragadda

(57) ABSTRACT

A system for inductively communicating signals in a magnetic resonance imaging system is presented. The system in one embodiment includes a first array of primary coils disposed on a patient cradle of the imaging system, and configured to acquire data from a patient positioned on the patient cradle. Additionally, the system includes a second array of secondary coils disposed under the patient cradle, wherein a number of secondary coils is less than or equal to the number of primary coils, wherein the first array of primary coils is configured to inductively communicate the acquired data to the second array of secondary coils.

20 Claims, 5 Drawing Sheets

SYSTEM AND METHOD FOR INDUCTIVELY COMMUNICATING DATA

BACKGROUND

Embodiments of the present disclosure relate to communication of signals, and more particularly to the inductive communication of signals in an imaging system.

In just a few decades, the use of magnetic resonance imaging (MRI) scanners has grown tremendously. MRI scans are being increasingly used to aid in the diagnosis of multiple sclerosis, brain tumors, torn ligaments, tendonitis, cancer, strokes, and the like. As will be appreciated, MRI is a noninvasive medical test that aids physicians in the diagnoses and treatment of various medical conditions. The enhanced contrast that an MRI scan provides between the different soft tissues of the body allows physicians to better evaluate the various parts of the body and determine the presence of certain diseases that may not be assessed adequately with other imaging methods such as X-ray, ultrasound, or computed tomography (CT).

An MRI system typically includes one or more coils to generate the magnetic field. Additionally, the MRI system also includes one or more MRI receiver coils configured to detect signals from a gyromagnetic material within a patient. These MRI receiver coil arrays typically entail use of bulky cables. Use of these bulky cables increases the difficulty in situating the receiver coils over the patient before the scanning procedure. Furthermore, the advent of parallel imaging has led to the increase in the number of MRI receiver channels. Unfortunately, this increase in the number of receiver channels has further exacerbated the problem with a corresponding increase in the number of bulky cables.

Some currently available techniques call for embedding a subset of the coils in the cradle underneath the patient. However, each coil is attached to a preamp, a cable, and baluns, all of which must be accommodated in the cradle. In addition, these techniques also call for the use of a switch or a multiplexer to connect different subsets of coils to receiver electronics as different portions of the anatomy are scanned.

Certain other demonstrated techniques entail the use of microwave or optical links to acquire signals without the use of cables. In these methods, the signal from each coil is amplified and then converted to an optical or microwave signal which is then beamed through space to a receiver in the scanner bore or outside the bore. The signal may or may not be demodulated to a different frequency and/or digitized before conversion. However, these signal conversions require placement of additional circuits on the coils, which can substantially increase the amount of power required by the coils, and lead to increased heat generation on the coils. The additional circuitry can also add to the weight and bulk of the coil arrays, and can potentially interfere with the radiofrequency (RF) fields being detected by the coils.

Moreover, some other currently available techniques call for positioning a posterior array at a fixed location under the cradle. Although these methods reduce the number of coils and associated hardware, these methods result in significant loss in signal-to-noise ratio (SNR). Additionally, certain other demonstrated techniques inductively couple the receive coils to anterior arrays using patient-bed coupling elements that are attached to the local imaging coils by internal cabling, and are inductively coupled to base coupling elements positioned at the sides of the cradle. However, the relatively large size of the coupling elements and the limited space at the side of the cradle limit the versatility of this approach, thereby making it hard to use these techniques with large arrays.

It would therefore be desirable to develop a lightweight array of receiver coils that can be easily positioned on or under the patient in order to circumvent associated problems, such as complexities of cables. Additionally, there is also a need to reduce the number of preamplifiers, cables, and associated hardware in the patient cradle. Moreover, it is desirable to achieve this reduction in hardware without degrading the SNR relative to that of conventional embedded coils.

BRIEF DESCRIPTION

In accordance with aspects of the present technique, a system for inductively communicating signals in a magnetic resonance imaging system is presented. The system includes a first array of primary coils disposed on a patient cradle of the imaging system, and configured to acquire data from a patient positioned on the patient cradle. Additionally, the system includes a second array of secondary coils disposed under the patient cradle, wherein a number of secondary coils is less than or equal to the number of primary coils, wherein the first array of primary coils is configured to inductively communicate the acquired data to the second array of secondary coils.

In accordance with another aspect of the present technique, a system for inductively communicating signals in a magnetic resonance imaging system is presented. The system includes a first array of primary coils disposed on a first flexible substrate configured to be disposed on or under a patient and configured to acquire signals from the patient positioned on a patient cradle in the imaging system. In addition, the system includes a second array of secondary coils disposed on a second flexible substrate having a first edge and a second edge, wherein the second flexible substrate is disposed over the first flexible substrate such that the secondary coils in the second array of secondary coils are aligned with at least a subset of primary coils in the first array of primary coils. The system also includes at least one electrical connector disposed along one or more edges of the second flexible substrate, wherein the at least one electrical connector is coupled to the secondary coils in the second array of secondary coils through cables that are internal to or mounted on the second flexible substrate, and wherein the at least one electrical connector is configured to be detachably coupled to one or more sides of a patient cradle, wherein the first array of primary coils is configured to inductively communicate the acquired signals to the second array of secondary coils.

In accordance with yet another aspect of the present technique, a method for inductively communicating signals in a magnetic resonance imaging system is presented. The method includes disposing a first array of primary coils on a patient cradle in the imaging system, wherein the first array of primary coils is configured to acquire signals from a patient positioned on the patient cradle. Furthermore, the method includes disposing a second array of secondary coils under the patient cradle. The method also includes advancing the patient cradle in the imaging system such that at least one subset of primary coils in the first array of primary coils is disposed proximate to the secondary coils in the second array of secondary coils during a scanning procedure. In addition, the method includes inductively communicating the signals acquired by the first array of primary coils to the second array of secondary coils.

In accordance with another aspect of the present technique, a system for magnetic resonance imaging is presented. The system includes an acquisition subsystem configured to acquire image data, wherein the acquisition subsystem includes a subsystem for inductively communicating data signals in the imaging system, wherein the subsystem includes a first array of primary coils disposed on a patient cradle of the imaging system, and configured to acquire signals from a patient positioned on the patient cradle, a second array of secondary coils disposed under the patient cradle, wherein a number of secondary coils is less than or equal to a number of primary coils, wherein the first array of primary coils is configured to inductively communicate the acquired signals to the second array of secondary coils. Moreover, the system includes a processing subsystem in operative association with the acquisition subsystem and configured to process the acquired image data.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As will be described in detail hereinafter, a method for inductively communicating data and various embodiments of systems for inductively communicating data are presented. By employing the method and systems for inductively communicating data described hereinafter, system size and complexity may be minimized, while enhancing the performance of the system.

Figure 1:
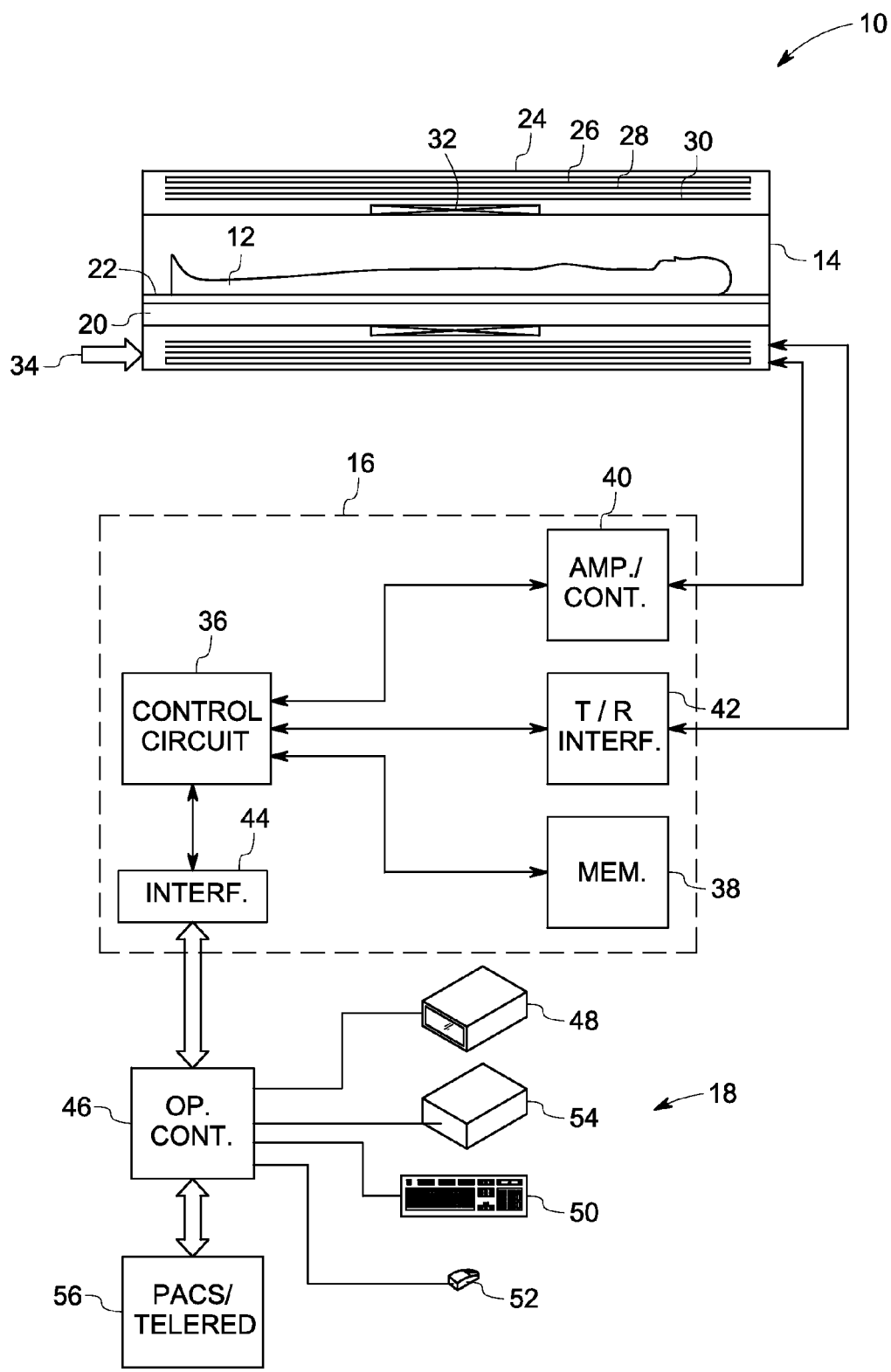
FIG. 1 is a block diagram illustration of an exemplary imaging system in the form of a magnetic resonance imaging (MRI) system configured to use the systems and methods of FIGS. 2-7.

Turning now to the drawings, and referring to FIG. 1, a block diagram of an embodiment of an MRI imaging system 10 is depicted. The MRI system 10 is illustrated diagrammatically as including a scanner 14, scanner control circuitry 16, and system control circuitry 18. While the MRI system 10 may include any suitable MRI scanner or detector, in the illustrated embodiment the system includes a full body scanner including a patient bore 20 into which a cradle 22 may be positioned to place a patient 12 in a desired position for scanning. The scanner 14 may be of any suitable field strength, including scanners varying from 0.5 Tesla to 3 Tesla and beyond. As used herein, the term patient is used to refer to a human person or animal that is the subject of the imaging application.

Additionally, the scanner 14 may include a series of associated coils for producing controlled magnetic fields, for generating radio-frequency (RF) excitation pulses, and for detecting emissions from gyromagnetic material within the patient 12 in response to such pulses. In the diagrammatical view of FIG. 1, a primary magnet coil 24 may be provided for generating a primary magnetic field generally aligned with patient bore 20. A series of gradient coils 26, 28 and 30 may be grouped in a coil assembly for generating controlled magnetic field gradients during examination sequences as will be described in greater detail hereinafter. A RF coil 32 may be provided for generating radio frequency pulses for exciting the gyromagnetic material. In the embodiment illustrated in FIG. 1, the coil 32 also serves as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from the RF coil 32. Such coils may include structures specifically adapted for target anatomies, such as head coil assemblies, and so forth. Moreover, receiving coils may be provided in any suitable physical configuration, including phased array coils, and so forth.

In a presently contemplated configuration, the gradient coils 26, 28 and 30 may have different physical configurations adapted to their function in the imaging system 10. As will be appreciated by those skilled in the art, the coils include conductive wires, bars or plates that are wound or cut to form a coil structure that generates a gradient field upon application of control pulses as described below. The placement of the coils within the gradient coil assembly may be done in several different orders. In one embodiment, a Z-axis coil may be positioned at an innermost location, and may be formed generally as a solenoid-like structure that has relatively little impact on the RF magnetic field. Thus, in the illustrated embodiment, the gradient coil 30 is the Z-axis solenoid coil, while coils 26 and 28 are Y-axis and X-axis coils respectively.

The coils of the scanner 14 may be controlled by external circuitry to generate desired fields and pulses, and to read signals from the gyromagnetic material in a controlled manner. As will be appreciated by those skilled in the art, when the material, typically bound in tissues of the patient 12, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. This transverse magnetic moment precesses around the main magnetic field direction, emitting RF signals that are detected by the scanner 14 and processed for reconstruction of the desired image.

The gradient coils 26, 28 and 30 may be configured to serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils have mutually orthogonal axes for the direction of their variation, enabling a linear field gradient to be imposed in an arbitrary direction with an appropriate combination of the three gradient coils.

The pulsed gradient fields perform various functions integral to the imaging process. Some of these functions are slice selection, frequency encoding and phase encoding. These functions may be applied along the X-axis, Y-axis and Z-axis of the original coordinate system or along other axes determined by combinations of pulsed currents applied to the individual field coils.

The slice select gradient determines a slab of tissue or anatomy to be imaged in the patient 12. The slice select gradient field may be applied simultaneously with a frequency selective RF pulse to excite a known volume of spins within a desired slice that precess at the same frequency. The slice thickness is determined by the bandwidth of the RF pulse and the gradient strength across the field of view.

The frequency encoding gradient is also known as the readout gradient, and is usually applied in a direction perpendicular to the slice select gradient. In general, the frequency encoding gradient is applied before and during the formation of the magnetic resonance (MR) echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction may be accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

As will be appreciated by those skilled in the art, a great number of variations may be devised for pulse sequences employing the exemplary gradient pulse functions described hereinabove as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of the scanner 14 are controlled by scanner control circuitry 16 to generate the desired magnetic field and RF pulses. In the diagrammatical view of FIG. 1, the scanner control circuitry 16 thus includes a control circuit 36 for commanding the pulse sequences employed during the examinations, and for processing received signals. The control circuit 36 may include any suitable programmable logic device, such as a CPU or digital signal processor of a general purpose or application-specific computer. Also, the control circuit 36 may further include memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of the scanner 14 is managed by amplification and control circuitry 40 and by transmission and receive interface circuitry 42. The amplification and control circuitry 40 includes amplifiers for each gradient field coil to supply drive current to the field coils in response to control signals from the control circuit 36. Transmit/receive (T/R) circuitry 42 includes additional amplification circuitry for driving the RF coil 32. Moreover, where the RF coil 32 serves both to emit the RF excitation pulses and to receive MR signals, the T/R circuitry 42 may typically include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 16 may include interface components 44 for exchanging configuration and image data with the system control circuitry 18. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means.

The system control circuitry 18 may include a wide range of devices for facilitating interface between an operator or radiologist and the scanner 14 via the scanner control circuitry 16. In the illustrated embodiment, for example, an operator controller 46 is provided in the form of a computer workstation employing a general purpose or application-specific computer. The workstation also typically includes memory circuitry for storing examination pulse sequence descriptions, examination protocols, user and patient data, image data, both raw and processed, and so forth. Further, the workstation may further include various interface and peripheral drivers for receiving and exchanging data with local and remote devices. In the illustrated embodiment, such devices include a conventional computer keyboard 50 and an alternative input device such as a mouse 52. A printer 54 may be provided for generating hard copy output of documents and images reconstructed from the acquired data. Moreover, a computer monitor 48 may be provided for facilitating operator interface. In addition, the system 10 may include various local and remote image access and examination control devices, represented generally by reference numeral 56 in FIG. 1. Such devices may include picture archiving and communication systems, teleradiology systems, and the like.

As previously noted, MRI receiver coil arrays typically entail use of bulky cables that make it more difficult to position the MRI receiver coil arrays on a patient before initiating a scanning procedure. In accordance with aspects of the present application, an exemplary system 60 for inductively communicating data acquired by a first array of primary coils 62 to a second array of secondary coils 68 that circumvents the shortcomings of the presently available techniques is presented. The first array of primary coils 62 includes one or more primary coils 64. The primary coils 64 are configured to acquire data, such as image data, from the patient 12 disposed on the patient cradle 66. Additionally, in accordance with aspects of the present technique, the primary coils 64 are configured to inductively communicate the acquired data to other coils, such as the secondary coils in the imaging system 10.

In accordance with aspects of the present technique, the primary coils 64 are freestanding coils or loops. As used herein, the term "freestanding coils or loops" is used to refer to coils that have no cables, preamplifiers, multiplexers, or power sources coupled to the coils. The primary coils 64 in the first array 62 may also be referred to as "untethered coils" as the primary coils 64 are not coupled to other components. Consequently, use of these freestanding primary coils 64 obviates the need for any cables to couple the primary coils to other components. Additionally, these primary coils 64 are resonant at the Larmor frequency. As will be appreciated, Larmor frequency is generally represented as:

$$\text{Larmor frequency} = \gamma B_o \quad (1)$$

where γ is the gyromagnetic ratio and for typical proton imaging is generally represented as:

$$\gamma = 42.58 \frac{\text{MHz}}{T} \quad (2)$$

Furthermore, $B_o$ is representative of a static magnetic field in Tesla (T). By way of example, the Larmor frequency for a 1.5 T system is 63.87 MHz. Accordingly, in a 1.5 T MRI system the free standing coils or loops in primary coil array will be resonant at about 63.87 MHz.

According to aspects of the present technique, the system 60 includes a first array of primary coils 62 disposed in a patient cradle 66 of an imaging system. Also, the terms patient support, patient cradle and patient table may be used interchangeably. By way of example, the imaging system may include the MRI system 10 of FIG. 1, while the patient cradle 66 may include the patient cradle 22 of FIG. 1. Also, the first array of primary coils 62 include MRI receive coils, such as the RF coils 32 (see FIG. 1), for example.

In a presently contemplated configuration, the first array of primary coils 62 are embedded in the patient cradle 66. Accordingly, the first array of primary coils 62 is embedded in the patient cradle 66 directly under the patient 12. In another embodiment the first array of primary coils 62 is disposed upon the patient cradle 66. By way of example, the first array of primary coils 62 may be integrated into a mat. This mat may then be disposed on the patient cradle 66. Furthermore, as previously noted, these primary coils 64 in the first array of primary coils 62 are configured to acquire data from a supine patient 12, for example, positioned on the patient cradle 66 in a head first or feet first orientation during a scanning procedure. Moreover, a number of primary coils 64 disposed in the patient cradle 66 may be in a range from about 16 to about 72. Specifically, the primary coils 64 in the first array of coils 62 are arranged such that the primary coils 64 cover the expanse of the patient cradle 66.

Furthermore, the system 60 includes a second array of secondary coils 68. Particularly, the second array of secondary coils 68 includes an arrangement of one or more secondary coils 70. The secondary coils 70 are configured to inductively receive data from the primary coils 64. It may be noted that the terms data and signals may be used interchangeably. In one embodiment, the secondary coils 70 in the second array of coils 68 may be arranged on a substrate, such as a support platform 72. These secondary coils 70 may also be referred to as "sniffer" coils. Also, the terms secondary coils and sniffer coils may be used interchangeably. In accordance with one embodiment, the second array of secondary coils 68 is positioned in a fixed position. Specifically, in one embodiment, the second array of secondary coils 68 may be positioned in a fixed position below the patient cradle 66 at the isocenter of the scanner 14 (see FIG. 1) of the imaging system 10. As used herein, the term "isocenter" of the scanner 14 is used to refer to centeredness in the superior/inferior (S-I) and left-right dimensions, but not necessarily in the anterior/posterior dimension, for a supine or prone patient. Additionally, in one embodiment, a size of the secondary coils 70 is smaller than a size of the primary coils 64. By way of example, the size of a secondary coil 70 may be about one fourth of the size of the primary coil 64. However, it may be noted that in certain embodiments, the size of the secondary coils 70 may be substantially similar to the size of the primary coil 64.

Also, in certain embodiments, a number of secondary coils 70 in the second array of secondary coils 68 is less than a number of primary coils 64 in the first array of primary coils 62. In particular, the number of secondary coils 70 in the Z-direction may typically be different from the number of primary coils 64 in the Z-direction. However, it is desirable that the number of secondary coils 70 in the X-direction be substantially similar to the number of primary coils 64 in the X-direction. By way of example, in the illustrated embodiment of FIG. 2, the number of primary coils 70 in the Z-direction is 8, while the number of primary coils 70 in the X-direction is 3. Accordingly, while it is desirable that the number of secondary coils 70 in the X-direction be 3, the number of secondary coils 70 in the Z-direction may be different from the number of primary coils 70 in the same direction. However, in certain other embodiments, the number of primary coils 64 may be substantially equal to the number of secondary coils 70. Additionally, in certain embodiments, the secondary coils 70 may be disposed at a distance from the primary coils 64 in a range from about 4 mm to about 7 cm.

Figure 2:
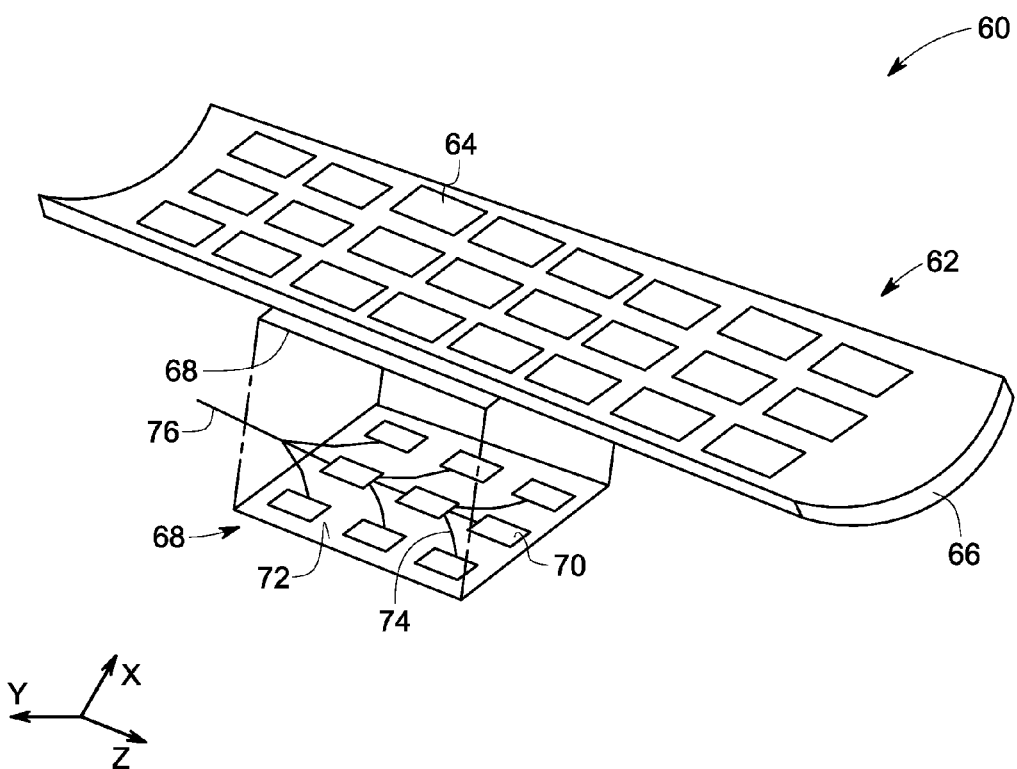
FIG. 2 is a diagrammatic illustration of a system for inductively communicating data, in accordance with aspects of the present technique.

With continuing reference to FIG. 2, the sniffer coils 70 are coupled to other electronics that aid in communicating the data received from the primary coils 64 to processing circuitry in the imaging system 10. By way of example, the sniffer coils 70 are coupled to preamplifiers (not shown in FIG. 2), where the preamplifiers are configured to amplify signals in the data received by the sniffer coils 70. Outputs of these preamplifiers are then communicated to receivers in the imaging system 10, for example. Reference numeral 74 is generally representative of cables used for coupling the secondary coils 70 to their respective channels. Also, reference numeral 76 is generally representative of a harness or cable bundle that is a collection of individual cables from the coils 70.

Furthermore, in one embodiment the shape of the second array 68 matches the shape of the first array 62. For example, if the shape of the patient cradle 66 is flat, consequently the shape of the first array 62 is also flat. Then it is desirable that the support platform 72 that supports the secondary coils 70 also has a similar flat shape. However, if the shape of the patient cradle 66 and hence the shape of the first array 62 is curved as shown in FIG. 2, then it is desirable that the support platform 72 also has a similar curved shape. Use of such a design facilitates maintaining the gap between each primary coil 64 and secondary coil 70 at a constant value, thereby resulting in equal coupling between each primary and secondary coil pairs.

As noted hereinabove, the support platform 72 is typically disposed at a fixed location at the isocenter of the scanner. However, in accordance with yet another aspect of the present technique, the support platform 72 is a moveable platform (not shown in FIG. 2) configured to be moveable within the imaging system 10. The moveable support platform 72 may also be disposed underneath the patient cradle 66. This moveable support platform may be moved in the superior/inferior direction (Z-direction) to fine-tune the alignment between the sniffer coils 70 and the primary coils 64 and will be described in greater detail with reference to FIGS. 5-7.

In one embodiment the second array 68 is positioned under the first array 62 by the moveable support platform 72 along rails or tracks (not shown in FIG. 2). The number of sniffer coils 70 can be equal to or less than the number of primary coils 64 such that the secondary array 68 is positioned under all or a subset of the first array 62. The rails or tracks can be used to keep the coils aligned along at least one direction. In the illustrated example, the number of coils in the Z-direction for both the first array 62 and second array 68 are such that the tracks can be used to move the second array 68 at least along the Z-direction. Furthermore, locking mechanisms (not shown in FIG. 2) such as set screws and pins may be employed to align the sniffer coils 70 under the respective primary coils 64.

Once the scanning procedure is initiated and as the patient cradle 66 is advanced into the imaging system 10 and more particularly into the patient bore 20 (see FIG. 1), at any given point in time at least a subset of the primary coils 64 in the first array 62 is disposed proximate to the sniffer coils 70 in the second array 68. Furthermore, during the scanning procedure, signals representative of an anatomical region of the patient 12 are acquired by the primary coils 64. Subsequently, the acquired signals are inductively communicated to the sniffer coils 70 in the second array 68. Specifically, in accordance with aspects of the present technique, signals acquired by the primary coils 64 in the first array 62 are inductively transmitted from the untethered primary coils 64 to the sniffer coils 70 without the use of any cabling. Moreover, as the patient cradle 66 is advanced to a different position, a different anatomical region in the patient is targeted. Also, a different subset of primary coils 64 is now disposed proximate to the sniffer coils 70. Signals corresponding to the different anatomical region are acquired by the primary coils 64 and are inductively communicated from the subset of primary coils 64 to the sniffer coils 70. Furthermore, the signals received by the sniffer coils 70 are amplified by preamplifiers, for example, and the amplified signals are transmitted to the receivers (not shown in FIG. 2) in the imaging system 10.

It may also be noted that the primary coils 64 may be disabled during RF transmit by use of passive RF blocking networks in each coil in the array. This disabling or detuning of the primary coils 64 aids in avoiding distortion of the transmit field which occurs if the receive coils are resonant during spin excitation. Furthermore, the secondary or sniffer 70 coils are disabled with the use of DC pulses by activating diodes in each sniffer coil 70 during transmit as in conventional cable connected designs.

Figure 3:
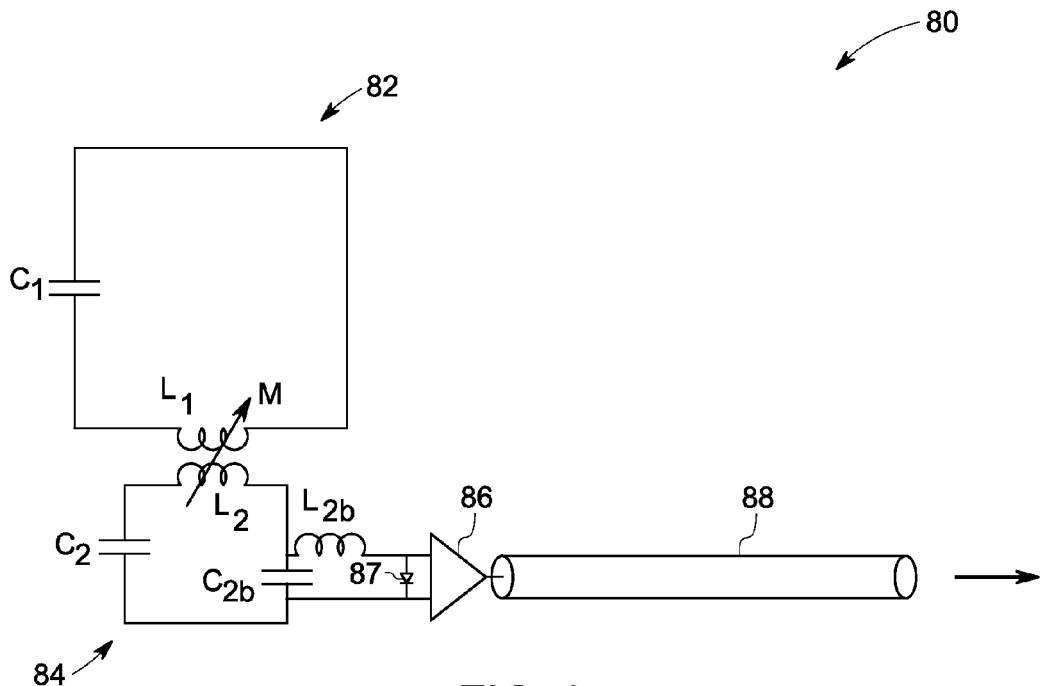
FIG. 3 is an equivalent circuit diagram representation of the system of FIG. 2, in accordance with aspects of the present technique.

Referring now to FIG. 3, a diagrammatic illustration 80 of a method of inductively transmitting data from the primary coils 64 (see FIG. 2) in the first array 62 (see FIG. 2) to the secondary coils 70 (see FIG. 2) in the second array 68 (see FIG. 2) is depicted. Reference numeral 82 is generally representative of an equivalent electronic circuit of the primary coil 64. Similarly, an equivalent electronic circuit of the secondary coil 70 is generally represented by reference numeral 84.

As depicted in FIG. 3, each primary coil 64 in the first array 62 is represented by a circuit that includes a loop with inductance $L_1$ and a first capacitor $C_1$. In a similar fashion, each secondary or sniffer coil 70 in the second array 68 is represented by a circuit that includes a loop with inductance $L_2$, and capacitors $C_2$ and $C_{2b}$. As the secondary coil 70 is brought into proximity with the primary coil 64, the two coils become inductively coupled and exhibit mutual inductance M. Additionally, the capacitor $C_{2b}$ and inductor $L_{2b}$ are used for impedance matching to a preamplifier 86. The sniffer coil 70 is coupled to the preamplifier 86, which in turn is coupled to a receiver (not shown in FIG. 3) via a transmission line 88. The transmission line 88 may have a coaxial or a stripline geometry. Also, the transmission line 88 may be disposed in plane of the secondary coils 70 or offset slightly below the secondary coils 70. It may be noted that the transmission line 88 is substantially similar to cables 74 of FIG. 2.

Furthermore, the primary coil 64 together with the sniffer coil 70 forms a coupled resonant structure. The primary coil 64 is configured to emit RF magnetic flux, where the flux may link with a sniffer coil 70 that is disposed proximate to the primary coil 64. Specifically, the primary coil 64 is disposed at a distance from the sniffer coil 70 so as to support enhanced signal transfer. The distance is dependent upon the thickness of the patient cradle 66 and any gap necessary to provide un-hindered movement between the patient cradle 66 and the scanner structure. Thus, the signals acquired by the primary coils 64 are inductively transmitted to the sniffer coils 70 without the use of cables to tether the primary coils 64.

Moreover, PIN diode 87 is used for active transmit blocking. During the RF transmit pulse, a DC signal is applied across the diode 87, lowering its impedance, and allowing the capacitor $C_{2b}$ and inductor $L_{2b}$ to form a high-impedance blocking circuit at the Larmor frequency. This blocks currents from flowing in the sniffer coil 70, thus reducing currents in primary coil 64 induced by the RF transmit pulse.

Figure 4:
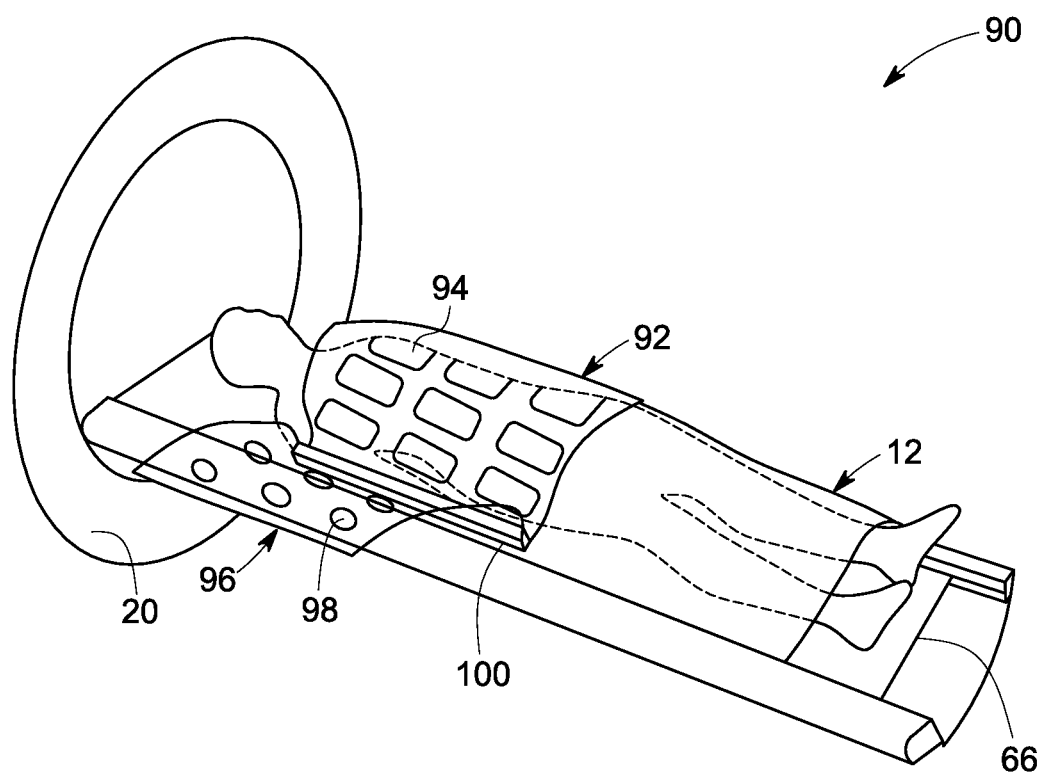
FIG. 4 is a diagrammatic illustration of another embodiment of a system for inductively communicating data, in accordance with aspects of the present technique.

In the embodiment of FIG. 2, the freestanding primary coils 64 are disposed in the patient cradle 66 and are configured to inductively transmit acquired signals to the sniffer coils 70 disposed below the patient cradle 66. FIG. 4 is a diagrammatic illustration 90 of another embodiment of a system for inductively communicating data from a first array of primary coils 92 to a second array of secondary or sniffer coils 96. In the embodiment depicted in FIG. 4, the first array of primary coils 92 includes one or more primary coils 94 disposed on a first flexible substrate. The first flexible substrate may be formed using a thin dielectric material such as a polyimide film or FR-4. In a presently contemplated configuration, the first flexible substrate is patterned in the form of a vest. This vest 92 of primary coils 94 may be worn by the patient 12. Furthermore, the primary coils 94 include freestanding coils that are tuned to the Larmor frequency. Consequently, the primary coils 94 have no cables, preamplifiers, or switches coupled thereto.

The vest 92 of primary coils 94 allows acquisition of data from an upper portion of the patient 12. In accordance with further aspects of the present technique, the first flexible substrate 92 having the primary coils 94 may be patterned based on the portion of the patient 12 being scanned. For example, if it is desirable to scan a lower portion of the patient 12, then the first flexible substrate 92 may be patterned in the form of trousers to be worn by the patient 12. The trousers having the primary coils 94 therefore aids in acquiring data from the lower portion of the patient 12. In addition, if it is desirable to scan the head of the patient 12, then the first flexible substrate 92 having the primary coils 94 may be fashioned as a helmet to be worn by the patient 12. Although the embodiment of FIG. 4 depicts the first array 92 as including a vest of primary coils 94, it may be noted that the first array 92 may be patterned in different shapes based on the part of the patient 12 being scanned.

In addition, the system 90 includes a second array of secondary coils 96. In the embodiment of FIG. 4, the second array 96 includes secondary coils or sniffer coils 98 disposed on a second flexible substrate. The second flexible substrate may be formed a thin dielectric material such as a polyimide film or FR-4. Moreover, the second flexible substrate may be fashioned in the form of a blanket, in one embodiment. Furthermore, this blanket 96 of sniffer coils 98 is secured to a side of the patient cradle 66. In one embodiment, the blanket 96 is secured to a side of the patient cradle 66 using at least one electrical connector 100. In certain embodiments, a system connector (not shown in FIG. 4) that is mateably couplable to the electrical connector 100 and disposed proximate the patient cradle 66 may be employed to operationally to the electrical connector 100 to the patient cradle 66. The electrical connector 100 is generally coupled to the sniffer coils 98 in the blanket 96 through cables (not shown in FIG. 4) that are internal to the blanket 96. However, in certain other embodiments, the electrical connector 100 may be coupled to the sniffer coils 98 in the blanket 96 through cables (not shown in FIG. 4) that are mounted on the blanket 96. Additionally, the blanket 96 is wrapped over the patient vest 92. Particularly, the blanket 96 is wrapped over the vest 92 such that the primary coils 94 in the vest 92 are aligned with the sniffer coils 98 in the blanket 96.

Moreover, the blanket of sniffer coils 96 may be fastened to the vest of primary coils 92. To that end, in certain embodiments, a first fastener (not shown in FIG. 4) is disposed on the blanket of sniffer coils 96. Also, a second fastener (not shown in FIG. 4) is disposed on the vest of primary coils 92. In one embodiment, the first fastener and the second fastener may be hook and loop strips, such as VELCRO. Alternatively, non-metallic, snap-on buttons may be used as the fasteners. The first fastener on the blanket of sniffer coils 96 is used to secure the blanket 96 to the second fastener on the vest of primary coils 92, thereby ensuring that the sniffer coils 98 in the blanket 96 are properly aligned with the primary coils 94 in the vest 92. The signals acquired by the primary coils 94 in the vest 92 are then inductively communicated from the primary coils 94 to the sniffer coils 98 in the blanket 96. The signals are subsequently transmitted to preamplifiers and receivers in the imaging system.

It may further be noted that in addition to the primary coils 94 disposed in the vest 92, primary coils may also be embedded in the cradle 66 to allow for multiple imaging applications. Moreover, sniffer coils may also be disposed below the cradle 66 in addition to the blanket 96 of sniffer coils 70.

In certain embodiments, an additional blanket of sniffer coils (not shown in FIG. 4) that is similar to the blanket of secondary coils 96 may be secured to the other side of the patient cradle 66. This blanket may be similarly aligned with at least a portion of the primary coils 94 in the vest 92.

Moreover, during a scanning procedure, as the patient cradle is advanced into the magnet bore, a different subset of primary coils in the first array of coils is positioned proximate to the sniffer coils in the second array of coils. However, in certain situations, the subset of primary coils may not be accurately aligned with the sniffer coils, thereby leading to reduced signal-to-noise ratio in the data acquired by the primary coils and inductively transmitted to the sniffer coils. Accordingly, it may be desirable to ensure that the subset of primary coils is accurately aligned with the sniffer coils.

Figure 5:
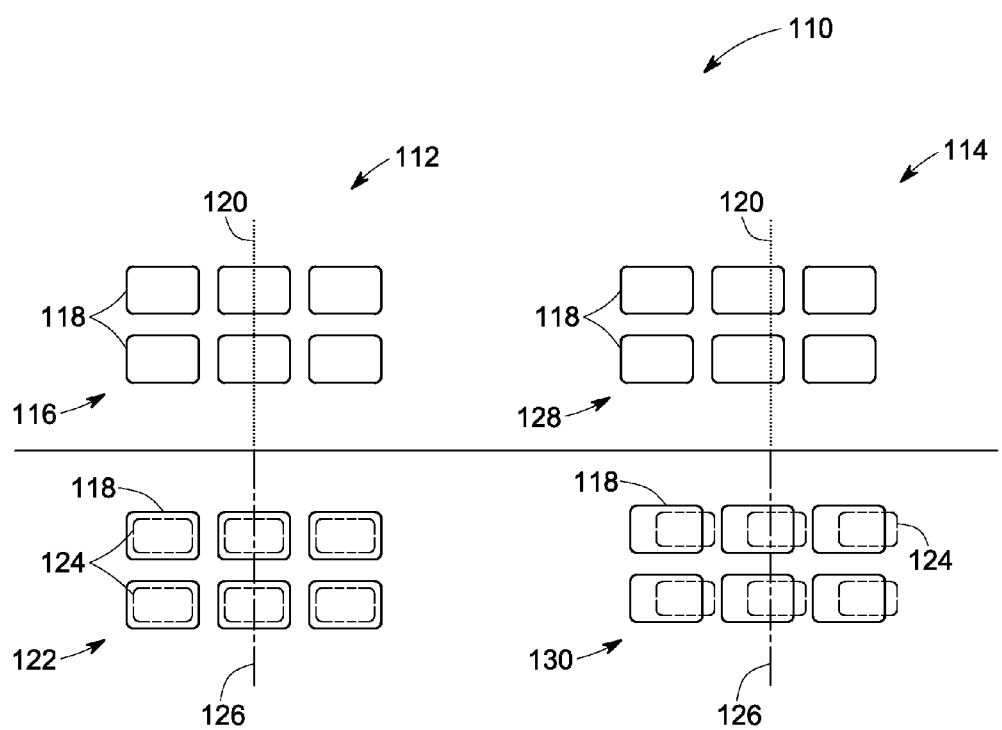
FIG. 5 is a diagrammatic illustration of alignment and misalignment of coils in the system for inductively communicating data of FIG. 2, in accordance with aspects of the present technique.

FIG. 5 is diagrammatic illustration 110 of a desirable alignment 112 of the primary coils and the sniffer coils. Also depicted in FIG. 5 is an undesirable misalignment 114 of the primary coils and the sniffer coils. In certain embodiments, a desirable alignment of the subset of primary coils with the sniffer coils entails a center-to-center alignment of the subset of primary coils with the sniffer coils. To that end, in one embodiment, a "landmark" is identified based on the anatomical region of the patient 12 being scanned. Once the scanning procedure is initiated, the patient cradle is moved into the patient bore such that identified landmark is positioned at the isocenter of the scanner. As previously noted, the default position of the sniffer coils is typically also the isocenter of the scanner.

Reference numeral 116 is generally representative of a position of primary coils 118 outside the magnet bore, such as the magnet bore 20 of FIG. 1, while the landmark selected in the anatomical region of the patient is represented by reference numeral 120. It may be noted that the primary coils 118 are positioned such that the identified landmark 120 is located at an isocenter 126 of the scanner. Furthermore, the sniffer coils 124 may be positioned at a fixed position about the isocenter 126 of the scanner. Alternatively, in one embodiment, the sniffer coils 124 may be mounted on a moveable platform.

Furthermore, reference numeral 122 is generally representative of a desired alignment of the subset of primary coils 118 with the sniffer coils 124. As previously noted, the size of the sniffer coils 124 in this example is smaller than the size of the primary coils 118. Accordingly, it is desirable to align a center of the smaller sniffer coil 124 with a center of the primary coil 118, as depicted by reference numeral 122.

Moreover, as the patient cradle is advanced into the magnet bore, there may be an undesirable misalignment between the primary coils 118 and the sniffer coils 124 based on the identified landmark 120. This misalignment is generally represented by reference numeral 130. Reference numeral 128 is generally indicative of a position of the primary coils 118 outside the magnet bore.

Figure 6:
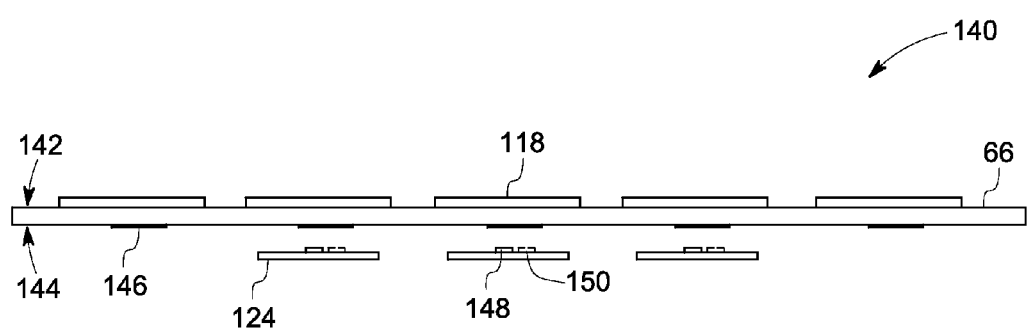
FIG. 6 is a diagrammatic illustration of a subsystem for aligning coils for use in the system for inductively communicating data of FIG. 2, in accordance with aspects of the present technique.

Hence, there exists a need for tuning the alignment of the subset of primary coils 118 with the sniffer coils 124. In accordance with aspects of the present technique, a subsystem and method for correctly aligning the subset of primary coils 118 with the sniffer coils is 124 presented. FIG. 6 is a diagrammatical illustration 140 of a subsystem for aligning a subset of primary coils with the sniffer coils for use in conjunction with the system for inductively communicating data of FIG. 1. Particularly, in the embodiment of FIG. 6, the primary coils 118 are disposed on a first side 142 of the patient cradle 66 while the sniffer coils 124 are disposed below a second side 144 of the patient cradle 66. Also, in the embodiment depicted in FIG. 6, the system 140 for correctly aligning the subset of primary coils 118 with the sniffer coils 124 is an optical alignment subsystem. In accordance with aspects of the present technique, the alignment subsystem includes a non-metallic optical reflector 146, an optical source 148 and an optical detector 150. Accordingly, in one embodiment, a non-metallic optical reflector 146 is disposed under each primary coil 118. In a presently contemplated configuration, the non-metallic optical reflector 146 is associated with a primary coil 118. Particularly, in one embodiment, the non-metallic optical reflector 146 is centered under the corresponding primary coil 118. By way of example, if the primary coil 118 is disposed on the first side 142 of the patient cradle 66 or embedded in the patient cradle 66, then the non-metallic optical reflector 146 is disposed on the second side 144 of the patient cradle 66. The non-metallic optical reflector 146 is configured to reflect a light beam from the optical source 148.

In certain other embodiments, the non-metallic optical reflectors 146 may also be positioned under only one primary coil per left-right row of coils. Particularly, in one embodiment, the non-metallic reflector 146 is positioned under a primary coil 118 that is disposed in the center or close to the center of left-right row. Furthermore, in this embodiment, in the entire array, each left-right row has a corresponding non-metallic optical reflector 146, hence forming a column of non-metallic optical reflectors 146 in the S/I direction, centered at each primary coil 118. Since the alignment is in the S/I direction, it may be sufficient to include the non-metallic optical reflectors 146 to span the S/I direction.

Furthermore, the optical source 148 is associated with each sniffer coil 124. In particular, the optical source 148 is disposed on each sniffer coil 124 such that the optical source 148 is directed towards the second side 144 of the patient cradle 66. Additionally, the optical detector 150 is associated with each sniffer coil 124. In one embodiment, the optical detector 150 is also disposed on each sniffer coil 124. The optical detector 150 is configured to detect light reflected by the non-metallic optical reflector 146. Examples of the low-power optical sources 148 include LEDs (light emitting diodes) or VCSEL (vertical cavity surface emitting laser). Also, an example of the optical detector 150 is a photodiode, selected such that the optical detector 150 has a high sensitivity in the wavelength range of the optical source 148. As previously described with reference to the primary coils 118, the optical source/detector pair may be positioned on only one sniffer coil per left-right row, corresponding to the primary coil that has a non-metallic optical reflector.

Light is transmitted from the optical source 148 and directed towards the non-metallic optical reflector 146. The light is reflected by the non-metallic optical reflector 146 and detected at the optical detector 150, if the source/detector pair is accurately aligned with the non-metallic optical reflector 146 disposed underneath the primary coil 118. However, if the sniffer coil 124 is not accurately aligned with the primary coil 118, then the light transmitted from the optical source 148 is not effectively reflected by the non-metallic optical reflector 146 and detected by the optical detector 150.

Accordingly, it is desirable to correct this misalignment between the primary coils 118 and the sniffer coils 124. Particularly, in one embodiment, the sniffer coils 124 mounted on the moveable platform may be translated in the +Z-direction in small incremental steps. At each step, light is transmitted by the optical source 148 towards the non-metallic optical reflector 146. If the received optical signal as measured by an output of the optical detector 150 increases, then the moveable platform having the sniffer coils 124 disposed thereon is further translated in the +Z-direction until the output of the optical detector 150 starts to decrease. Subsequently, the moveable platform having the sniffer coils 124 is translated such that the sniffer coils 124 are now positioned at a location corresponding to a peak output of the optical detector 150. The peak output of the optical detector 150 corresponds to a center-to-center alignment of the primary coil 118 and the sniffer coil 124.

However, if the received output signal as measured by an output of the optical detector 150 does not increase as the moveable platform having the sniffer coils 124 is translated in the +Z-direction, then the sniffer coils 124 are translated in the −Z-direction until the output of the optical detector 150 starts to decrease. Subsequently, the sniffer coils 124 are translated such that the sniffer coils 124 are now disposed at a location corresponding to a peak output of the optical detector 150, where the peak output of the optical detector 150 corresponds to a center-to-center alignment of the primary coil 118 and the sniffer coil 124. Following the procedure described hereinabove, center-to-center alignment between the primary coils 118 and the sniffer coils 124 is achieved at the desired imaging position of the patient cradle 66 as the patient cradle 66 is advanced into the magnet bore 20 during the scanning procedure.

In accordance with further aspects of the present technique, in lieu of the optical alignment subsystem of FIG. 6, a prescan signal may be employed to aid in accurately aligning the primary coils 118 with the sniffer coils 124. Particularly, the prescan signal is monitored as the sniffer coils 124 are translated in small incremental steps. Data corresponding to a position of the sniffer coils 124 that corresponds to a peak signal are used for imaging.

Figure 7:
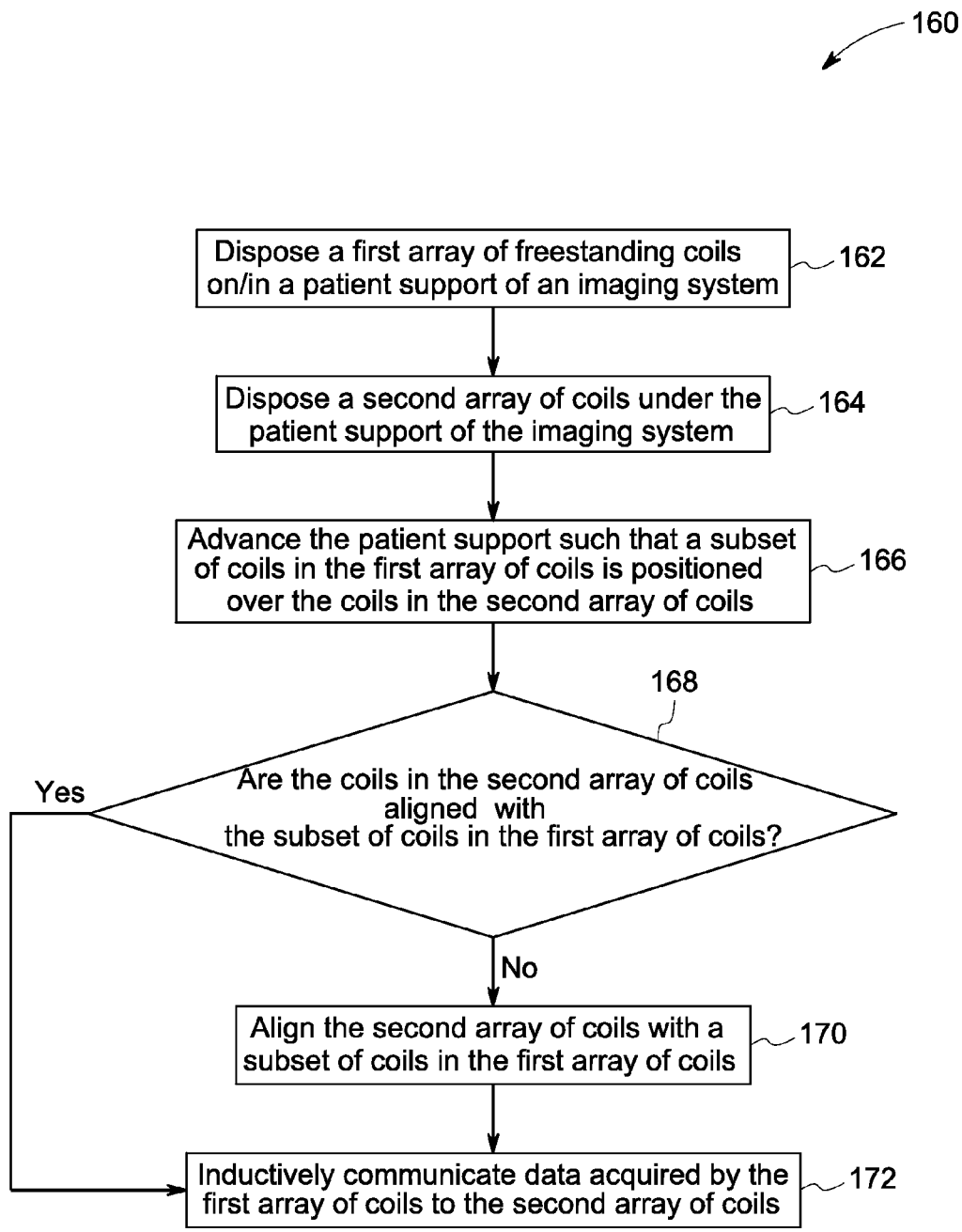
FIG. 7 is a flow chart depicting an exemplary method for inductively communicating data, in accordance with aspects of the present technique.

Furthermore, in accordance with aspects of the present technique, an exemplary method for inductively communicating signals from freestanding primary coils to sniffer coils is presented. Turning now to FIG. 7, a flowchart 160 illustrating an exemplary method for inductively communicating signals, in accordance with aspects of the present technique, depicted. The method starts at step 162, where a first array of primary coils is provided. In one embodiment, the primary coils are embedded in or disposed on a patient cradle. By way of example, the first array 62 (see FIG. 2) of primary coils 64 (see FIG. 2) is embedded in the patient cradle 66 (see FIG. 2). Alternatively, the primary coils 94 (see FIG. 4) are disposed in the vest 92 (see FIG. 4). Subsequently, as indicated by step 164, a second array of sniffer coils is provided. For example, in one embodiment, the sniffer coils 70 (see FIG. 2) of the second array 68 (see FIG. 2) are disposed at the isocenter of the scanner below the patient cradle 66. However, in certain other embodiments, the sniffer coils 98 (see FIG. 4) are disposed in a blanket 96 (see FIG. 4) configured to be disposed over the vest 92.

Furthermore, a patient, such as the patient 12 (see FIG. 1) may be positioned on the patient cradle 66. Data corresponding to the patient are then acquired during a scanning procedure. To that end, the patient cradle may be advanced into the imaging system (see FIG. 1) to aid in the acquisition of data from the patient, as indicated by step 166. During the scanning procedure, the patient cradle 66 having the patient 12 disposed thereon is advanced into the patient bore 20 (see FIG. 1). Particularly, the patient cradle is advanced such that at least a subset of primary coils in the first array of coils is positioned proximate to the sniffer coils in the second array. Subsequently, the patient cradle is advanced to different positions thereby targeting different anatomical regions in the patient. Consequent to the movement of the patient cradle, a different subset of primary coils is disposed proximate to the sniffer coils.

As noted hereinabove, as the patient cradle is advanced into the magnet bore, a different subset of primary coils in the first array of coils is positioned proximate to the sniffer coils in the second array of coils. However, in certain situations, the subset of primary coils may not be accurately aligned with the sniffer coils, thereby leading to reduced signal-to-noise ratio in the acquired data. Accordingly, it may be desirable to verify whether the subset of primary coils is accurately aligned with the sniffer coils, as indicated by step 168. In certain embodiments, the verification of the alignment of the subset of primary coils with the sniffer coils entails ensuring a center-to-center alignment of the subset of primary coils with the sniffer coils.

Also, at step 168, if it is verified that the subset of primary coils is not accurately aligned with the sniffer coils, then it is desirable to correct any misalignment between the subset of primary coils with sniffer coils. Accordingly, at step 170, the subset of primary coils is accurately aligned with the sniffer coils. In one embodiment, the primary coils are aligned with the sniffer coils using the method previously described with reference to FIGS. 5-6.

In accordance with exemplary aspects of the present technique, during the scanning procedure, at a given position of the patient cradle, signals are acquired by the subset of primary coils. The acquired signals are then inductively transmitted to the sniffer coils. The signals received by the sniffer coils may be amplified by preamplifiers, for example, and transmitted on to the receivers, as previously described, as depicted by step 172. Furthermore, as the patient cradle is advanced to different positions, different anatomical regions in the patient are targeted. Consequent to the movement of the patient cradle, a different subset of primary coils is disposed proximate to the sniffer coils. The signals acquired by the subset of primary coils at the various positions of the patient cradle are inductively communicated to the sniffer coils. The sniffer coils in turn transmit the received signals to processing circuitry that may include preamplifiers. The output of the processing circuitry is then transmitted to the receivers.

With returning reference to the decision block 168, if it is verified that the subset of primary coils is aligned with the sniffer coils, then control is passed to step 172, where the signals acquired by the subset of primary coils are inductively communicated to the sniffer coils. As previously noted, the sniffer coils in turn transmit the received signals to processing circuitry that may include preamplifiers. The output of the processing circuitry is then transmitted to the receivers.

As noted hereinabove, the verification of the alignment of the subset of primary coils with the sniffer coils entails ensuring a center-to-center alignment of the subset of primary coils with the sniffer coils. To that end, in one embodiment, a "landmark" is identified based on the anatomical region of the patient 12 being scanned. Once the scanning procedure is initiated, the patient cradle is moved into the patient bore such that identified landmark is positioned at the isocenter of the scanner. As previously noted, the default position of the sniffer coils is typically also the isocenter of the scanner.

Furthermore, the foregoing examples, demonstrations, and process steps such as those that may be performed by the imaging system 10, may be implemented by suitable code on a processor-based system, such as a general-purpose or special-purpose computer. It should also be noted that different implementations of the present technique may perform some or all of the steps described herein in different orders or substantially concurrently, that is, in parallel. Furthermore, the functions may be implemented in a variety of programming languages, including but not limited to C++ or Java. Such code may be stored or adapted for storage on one or more tangible, machine readable media, such as on data repository chips, local or remote hard disks, optical disks (that is, CDs or DVDs), memory or other media, which may be accessed by a processor-based system to execute the stored code. Note that the tangible media may comprise paper or another suitable medium upon which the instructions are printed. For instance, the instructions may be electronically captured via optical scanning of the paper or other medium, then compiled, interpreted or otherwise processed in a suitable manner if necessary, and then stored in a data repository or memory.

The methods for inductively communicating MRI signals and the various embodiments of the systems for inductively communicating signals described hereinabove dramatically enhance the performance of the imaging system. Particularly, use of inductive coupling for communicating signals from the freestanding primary coils to the sniffer coils obviates the use of active elements on or near the coils, thereby circumventing the need for supplying power to the active elements. Specifically, the design of the system for inductively communicating signals described hereinabove also obviates the need for preamplifiers, mixers, or analog-to-digital converters (ADCs) on the coils. Consequently, this design allows use of a relatively small array of sniffer coils positioned around the scanner isocenter to receive the signals from the different subsets of primary coils, depending on which subset of primary coils is disposed at the isocenter of the scanner as the patient cradle is advanced.

Furthermore, the lightweight primary coil arrays in the form of a vest significantly increase patient comfort and scanner throughput. In addition, the need for bulky cable baluns used to block common-mode currents in cables is also minimized or eliminated, thereby also reducing the significant amounts of heat dissipated by the bulky cable baluns. Moreover, reducing the number of preamplifiers, cables, baluns, and switches in the patient cradle also reduces cost and complexity of the imaging system.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for inductively communicating signals in a magnetic resonance imaging system, the system comprising:
    a first array of primary coils disposed on a patient cradle of the imaging system, and configured to acquire data from a patient positioned on the patient cradle;
    a second array of secondary coils disposed under the patient cradle, wherein a number of secondary coils is less than or equal to a number of primary coils,
    wherein the first array of primary coils is configured to inductively communicate the acquired data to the second array of secondary coils;
    an alignment subsystem configured to aid in aligning the second array of secondary coils with at least one subset of primary coils in the first array of primary coils, wherein the alignment subsystem comprises:
        a non-metallic optical reflector associated with one or more primary coils in the first array of primary coils, wherein the non-metallic optical reflector is centered below the primary coils on a second side of the patient cradle;
        an optical source associated with one or more secondary coils in the second array of secondary coils, wherein the optical source is configured to direct an optical beam toward the non-metallic optical reflector; and
        an optical detector associated with one or more secondary coils in the second array of secondary coils, wherein the optical detector is configured to detect an optical beam reflected by the non-metallic optical reflector.

2. The system of claim 1, wherein the first array of primary coils comprises freestanding coils.

3. The system of claim 2, wherein the primary coils in the first array of primary coils are not coupled to cables, preamplifiers, multiplexers, or power sources.

4. The system of claim 1, wherein the first array of primary coils is embedded in the patient cradle or disposed on top of the patient cradle.

5. The system of claim 4, wherein the first array of primary coils is embedded in the patient cradle such that the first array of primary coils is disposed directly under the patient.

6. The system of claim 1, wherein the primary coils in the first array of primary coils are tuned to the Larmor frequency.

7. The system of claim 1, wherein the coils in the second array of secondary coils are coupled to preamplifiers.

8. The system of claim 1, wherein a size of the secondary coils is less than a size of the primary coils.

9. The system of claim 1, wherein the secondary coils are configured to receive signals from at least one subset of primary coils, the subset of primary coils positioned proximate to the second array of secondary coils as the patient cradle is advanced in the imaging system in a first direction during a scanning procedure.

10. The system of claim 9, wherein the second array of secondary coils is disposed at a fixed location below the patient cradle.

11. The system of claim 9, wherein the second array of secondary coils is disposed on a moveable support platform that is configured to be translated in a first direction, a second direction, or both the first direction and the second direction to aid in aligning the first array of primary coils with the second array of secondary coils.

12. The system of claim 1, wherein the second array of secondary coils is configured to communicate the signals received from the first array of primary coils to receivers in the imaging system.

13. A method for inductively communicating signals in a magnetic resonance imaging system, the method comprising:
    disposing a first array of primary coils on a patient cradle in the imaging system, wherein the first array of primary coils is configured to acquire signals from a patient positioned on the patient cradle;
    disposing a second array of secondary coils under the patient cradle;
    advancing the patient cradle in the imaging system such that at least one subset of primary coils in the first array of primary coils is disposed proximate to the secondary coils in the second array of secondary coils during a scanning procedure;
    aligning the second array of secondary coils with the at least one subset of primary coils in the first array of primary coils, wherein aligning the second array of secondary coils with the at least one subset of primary coils comprises:
        identifying a landmark based on an anatomical region in the patient being scanned;
        disposing the patient cradle such that the identified landmark is positioned at an isocenter of the imaging system; and
        verifying a center-to-center alignment of the second array of secondary coils with the at least one subset of primary coils, wherein verifying the center-to-center alignment of the second array of secondary coils with the at least one subset of primary coils comprises:
            configuring a non-metallic optical reflector with at least one primary coil in the first array of primary coils, wherein the non-metallic optical reflector is centered below the at least one primary coil on a second side of the patient cradle;
            configuring an optical source associated with at least one secondary coil in the second array of secondary coils, wherein the optical source is configured to direct an optical beam toward the non-metallic optical reflector; and
            configuring an optical detector associated with at least one secondary coil in the second array of secondary coils, wherein the optical detector is configured to detect an optical beam reflected by the non-metallic optical reflector; and
            inductively communicating the signals acquired by the first array of primary coils to the second array of secondary coils.

14. The method of claim 13, further comprising coupling the secondary coils in the second array of secondary coils to preamplifiers to amplify the received signals.

15. The method of claim 14, further comprising communicating outputs of the preamplifiers to one or more receivers in the imaging system.

16. The method of claim 13, wherein disposing the second array of secondary coils under the patient cradle comprises positioning the second array of secondary coils at a fixed position under the patient cradle at an isocenter of the imaging system.

17. The method of claim 13, wherein disposing the second array of secondary coils comprises arranging the second array of secondary coils on a movable support platform to aid in aligning the second array of secondary coils with the subset of primary coils in the first array of primary coils.

18. The method of claim 17, further comprising verifying alignment of the secondary coils in the second array of secondary coils with the subset of the primary coils in the first array of primary coils as the patient cradle is advanced in the imaging system.

19. The method of claim 13, wherein verifying the center-to-center alignment of the second array of secondary coils with the at least one subset of primary coils comprises:
    translating the second array of secondary coils in a first direction;
    directing an optical beam generated by the optical source towards the non-metallic reflector;
    monitoring a signal reflected by the non-metallic optical reflector and detected by the optical detector; and
    translating the second array of secondary coils in the first direction or a second direction that is opposite to the first direction based on the reflected signal detected by the optical detector to align the second array of secondary coils with the at least one subset of primary coils in the first array of primary coils.

20. The method of claim 13, wherein verifying the center-to-center alignment of the second array of secondary coils with the at least one subset of primary coils comprises:
    monitoring a prescan signal as the second array of secondary coils is translated in a first direction; and
    determining a position of the second array of secondary coils corresponding to a maximum value of the prescan signal.

* * * * *